United States Patent
Cai et al.

(10) Patent No.: US 9,568,755 B2
(45) Date of Patent: Feb. 14, 2017

(54) DISPLAY DEVICE

(71) Applicants: BOE TECHNOLOGY GROUP CO., LTD., Beijing (CN); BEIJING BOE VISION-ELECTRONIC TECHNOLOGY CO., LTD., Beijing (CN)

(72) Inventors: Laishou Cai, Beijing (CN); Kunjun He, Beijing (CN)

(73) Assignees: BOE TECHNOLOGY GROUP CO., LTD., Beijing (CN); BEIJING BOE VISION-ELECTRONIC TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/386,018

(22) PCT Filed: Dec. 14, 2013

(86) PCT No.: PCT/CN2013/089451
§ 371 (c)(1),
(2) Date: May 26, 2016

(87) PCT Pub. No.: WO2015/010420
PCT Pub. Date: Jan. 29, 2015

(65) Prior Publication Data
US 2016/0282662 A1 Sep. 29, 2016

(30) Foreign Application Priority Data
Jul. 22, 2013 (CN) .......................... 2013 1 0308646

(51) Int. Cl.
*G02F 1/1333* (2006.01)
*H05K 5/02* (2006.01)

(52) U.S. Cl.
CPC ....... *G02F 1/133308* (2013.01); *H05K 5/0217* (2013.01); *H05K 5/0243* (2013.01);
(Continued)

(58) Field of Classification Search
CPC ................ G02F 1/133308; G02F 2001/13332; G02F 2201/46; G02F 2001/133314; H05K 5/0217; H05K 5/0243
(Continued)

(56) References Cited

U.S. PATENT DOCUMENTS

2002/0075425 A1* 6/2002 Yoshino ............ G02F 1/133308
349/58
2011/0143823 A1* 6/2011 Holman, IV ........ H04M 1/0237
455/575.4
(Continued)

FOREIGN PATENT DOCUMENTS

| CN | 2750626 Y | 1/2006 |
| CN | 201527518 U | 7/2010 |

(Continued)

OTHER PUBLICATIONS

First Chinese Office Action dated May 5, 2015; Appln. No. 201310308646.1.
(Continued)

*Primary Examiner* — Anthony Haughton
*Assistant Examiner* — Yahya Ahmad
(74) *Attorney, Agent, or Firm* — Ladas & Parry LLP

(57) ABSTRACT

A display device is provided, comprising: a time sequence control board (300); and a back plate (100), comprising one main body and a plurality of edges, the time sequence control board (300) being attached to one of the edges of the back plate (100) with a connection member (200), the connection member (200) comprising a buckling part (210) and a connection part (220) connected with the buckling
(Continued)

part, the buckling part (210) being used to buckle the time sequence control board (300), and the connection part (220) being connected with the edge of the back plate (100).

18 Claims, 3 Drawing Sheets

(52) U.S. Cl.
CPC .............. *G02F 2001/13332* (2013.01); *G02F 2001/133314* (2013.01); *G02F 2201/46* (2013.01)

(58) Field of Classification Search
USPC ............................... 361/679.01; 248/917–923
See application file for complete search history.

(56) References Cited

U.S. PATENT DOCUMENTS

| | | | | |
|---|---|---|---|---|
| 2012/0057093 | A1* | 3/2012 | Zhang | G02F 1/133308 349/60 |
| 2014/0185252 | A1* | 7/2014 | Sakurada | G02F 1/133308 361/752 |
| 2014/0362325 | A1* | 12/2014 | Lee | G02F 1/133308 349/58 |
| 2015/0277179 | A1* | 10/2015 | Nishi | G02B 6/0088 349/58 |
| 2015/0282334 | A1* | 10/2015 | Yamamoto | G02F 1/133308 362/97.1 |
| 2015/0304599 | A1* | 10/2015 | Yamamoto | H04N 5/645 348/836 |
| 2015/0313030 | A1* | 10/2015 | Ren | G06F 1/1601 361/679.22 |

FOREIGN PATENT DOCUMENTS

| | | |
|---|---|---|
| CN | 202228487 U | 5/2012 |
| CN | 202548470 U | 11/2012 |
| CN | 103364977 A | 10/2013 |
| JP | 2002-131726 A | 5/2002 |
| JP | 2008-076854 A | 4/2008 |
| TW | 200919010 A | 5/2009 |

OTHER PUBLICATIONS

International Search Report mailed Apr. 18, 2014; PCT/C2013/089451.
International Search Report and Written Opinion both dated Apr. 18, 2014; PCT/CN2013/089451.

* cited by examiner

DISPLAY DEVICE

CROSS REFERENCE TO RELATED APPLICATIONS

This application is based on International Application No. PCT/CN2013/089451 filed on Dec. 14, 2013, which claims priority to Chinese National Application No. 201310308646.1 filed on Jul. 22, 2013. The entire contents of each and every foregoing application are incorporated herein by reference.

TECHNICAL FIELD

Embodiments of the present invention relate to a display device.

BACKGROUND

From a display plane side, a display device usually sequentially comprises a front frame, a display screen, a backlight module, a time sequence control board, a back plate and a rear cover.

For a usual display device, the time sequence control board is mounted on an upper edge of the back plate, and at present, the time sequence control board and the back plate are connected through a glue and then are connected with the display screen. As a fixing manner with the glue is not firm, during transporting and failing experiment, the time sequence control board easily detaches, a winding displacement for chip on film (COF) may be scratched and thus which renders defects such as blurred screen.

To solve the above problem, the front frame of a current display device comprises a plastic frame and an iron frame, after the time sequence control board and the back plate are glued, the display screen, the backlight module and the back plate need to be fixed on the iron frame with screws after they are assembled and then integrally disposed into the front frame, and are finally covered with the rear cover, thus, mounting holes of the screws need to be prearranged in upper, lower, left and right edges of the iron frame, and therefore, widths of and upper and lower rims of the front frame and the display screen are increased, which narrows display region of the display screen.

SUMMARY

The embodiment of the present invention provides a display device, which can prevent detaching of the time sequence control board, avoid scratching a display screen and then avoid generating bright line of the display screen, and reduce widths of upper and lower edges of a front frame, increase an area of a display region of the display screen, and achieve a super-thin display device.

The embodiment of the present invention provides a display device, comprising: a time sequence control board; and a back plate, comprising one main body and a plurality of edges, the time sequence control board being attached to one of the edges of the back plate with a connection member, the connection member comprising a buckling part and a connection part connected with the buckling part, the buckling part being used to buckle the time sequence control board, and the connection part being connected with the edge of the back plate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiments of the present invention will be further detailed hereinafter in conjunction with drawings. Following embodiments are not intended to limit the scope of the present invention.

Figure 4:
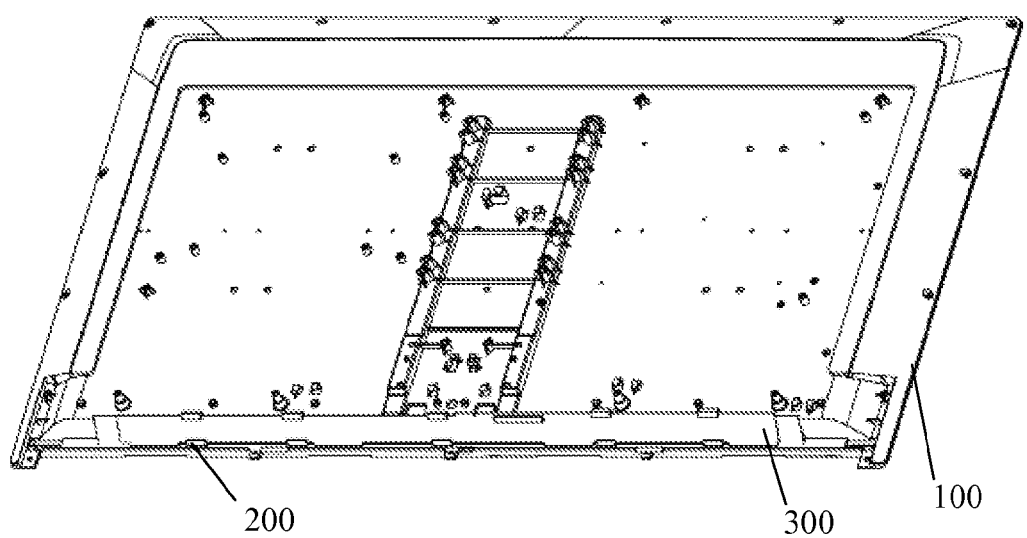
FIG. 4 is a schematic structural view after a back plate and a time sequence control board are assembled according to an embodiment of the present invention.
Figure 5:
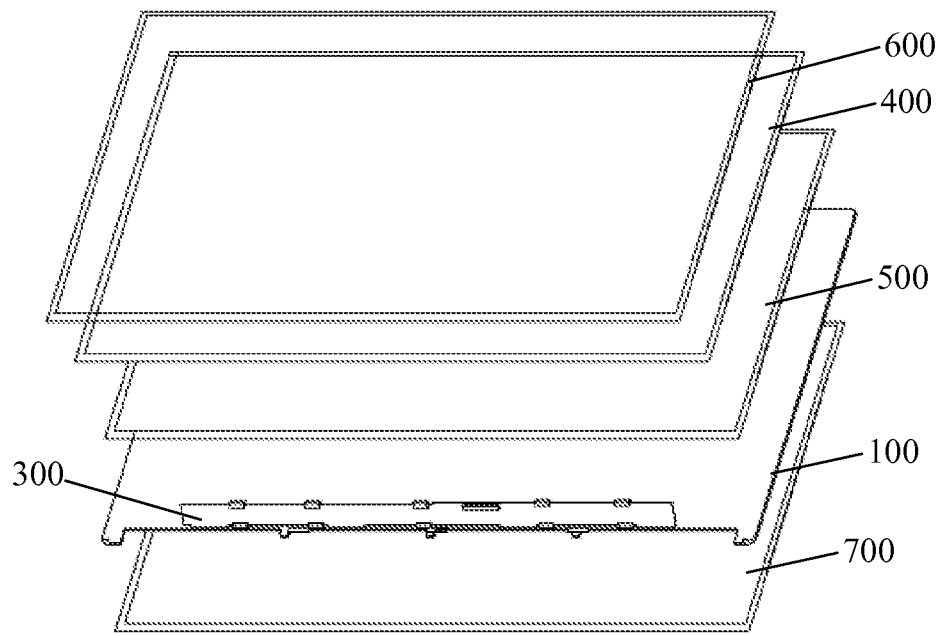
FIG. 5 is a mounting principle view of a display device according to an embodiment of the present invention.

As shown in FIGS. 4 and 5, a display device according to an embodiment of the present invention comprises: a time sequence control board 300 and a back plate 100, wherein, the back plate 100 comprises a main body and a plurality of edges, and the time sequence control board 300 is attached to one edge of the back plate 100 with a plurality of connection members 200, the connection member 200 comprises a buckling part 210 and a connection part 220 connected with the buckling part 210, the buckling part 210 is used to buckle the time sequence control board 300, and the connection part 220 is connected with the edge of the back plate 100.

Exemplarily, the display device further comprises a front frame 600, a display screen 400, a backlight module 500 and a rear cover 700.

Exemplarily, the display screen according to the embodiment of the present invention may be a liquid crystal display screen.

Exemplarily, the connection part is connected to a lower edge of the back plate.

Figure 1:
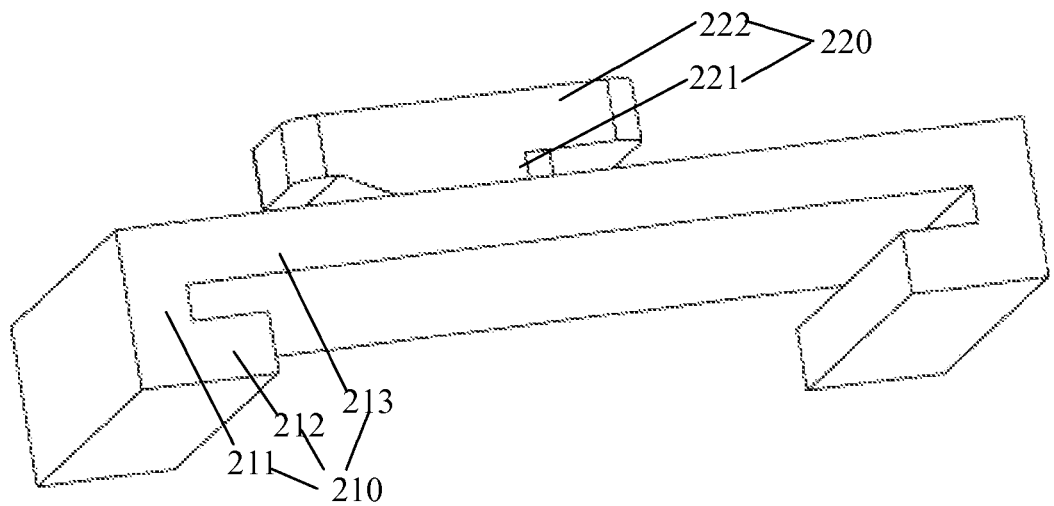
FIG. 1 is an axonometric draw of an exemplary connection member along one direction according to an embodiment of the present invention.
Figure 2:
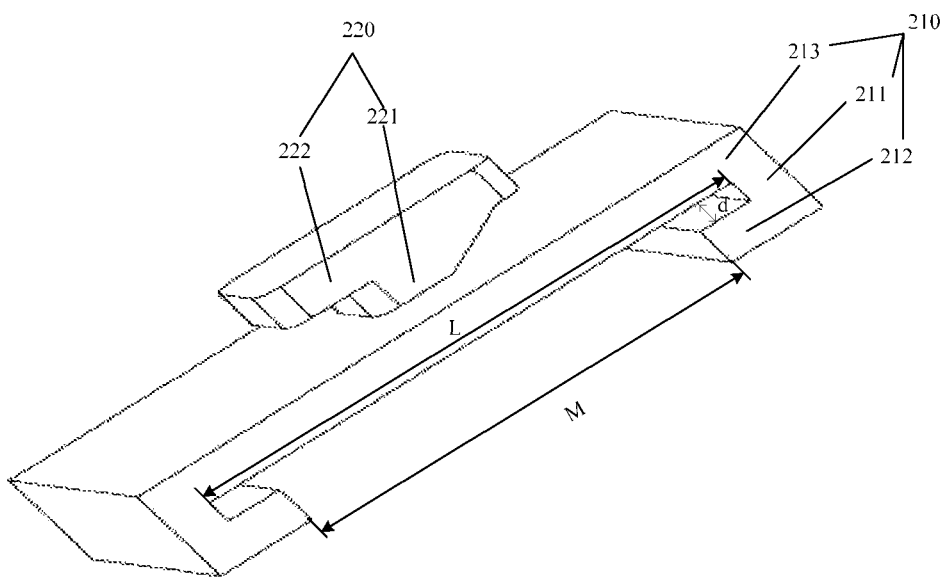
FIG. 2 is an axonometric draw of the exemplary connection member along another direction according to an embodiment of the present invention.

Exemplarily, FIGS. 1 and 2 show two axonometric drawings along two different directions of the connection member according to the embodiment of the present invention, as shown in FIGS. 1 and 2, the buckling part 210 is in a concave shape, such as, in a form of the Chinese character "凹", comprising: a horizontal segment 213; two vertical segments 211 provided at two ends of and connected with the horizontal segment; two stop blocks 212, each provided at an end of the vertical segment not connected with the horizontal segment, and there is a gap d between the stop block 212 and the horizontal segment 213, which may be used to buckle the time sequence control board 300.

Exemplarily, the gap d is equal to a thickness of the time sequence control board 300. An inner length of the horizontal segment 213 is L which is equal to or slightly smaller than a width of the time sequence control board, a distance M between end parts of the two stop blocks 212 along a length direction of the horizontal segment is smaller than the width L of the time sequence control board, and the time sequence control board 300 is buckled between the stop block 212 and the horizontal segment 213 of the buckling part, so that the time sequence control part 300 does not detach.

Exemplarily, the connection part 220 is in a convex shape, for example, in a form of the Chinese character "凸", comprising a protruding part 221 and a main body 222, wherein the protruding part 221 of the connection part is fixed to a back part (the back part refers to a side of the horizontal segment of the buckling part 210 in the concave shape opposite to an opening direction of the buckling part) of the horizontal segment 213 of the buckling part 210. For example, the protruding part 221 of the connection part is fixed to a middle of the back part of the horizontal segment 213 of the buckling part 210, that is, the protruding part 221 is fixed to the middle of the horizontal segment 213 in the length direction so as to achieve better and more firm connection.

It needs to be noted that the connection part 220 and the buckling part 210 may be formed as an integral body.

Figure 3:
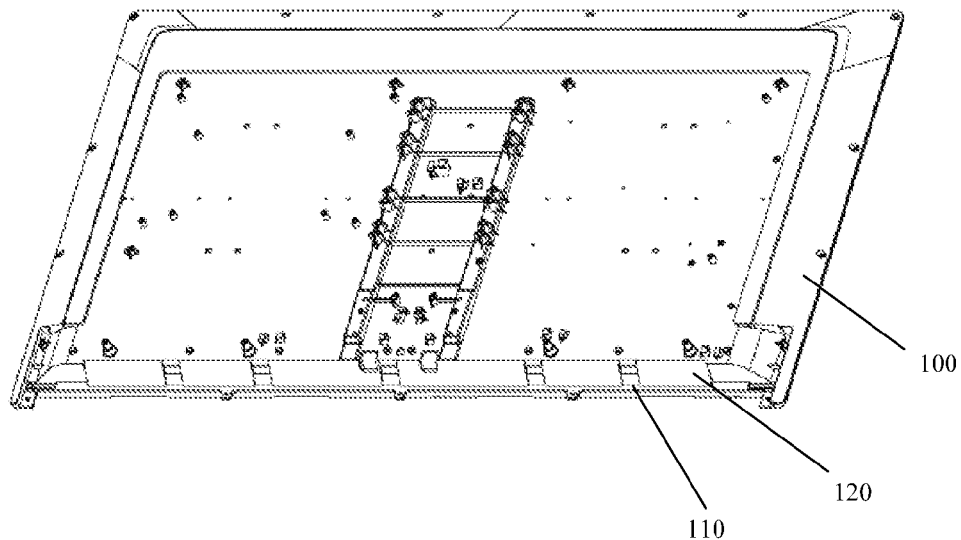
FIG. 3 is a schematic structural view of a back plate according to an embodiment of the present invention.

In connection with FIGS. 2, 3 and 4, the back plate 100 is provided with a snap groove 110 in an edge, and the snap groove 110 is used to buckle the connection part 220, and a width of an inner space of the snap groove 110 is larger than a width of an opening of the snap groove 110. Specifically, the main body 222 of the connection part passes through the opening of the snap groove 110 and enters into the inner space of the snap groove 110 and is rotated by a certain angle, so that the main body 222 of the connection part is snapped within the snap groove 110.

Exemplarily, as shown in FIG. 3, the back plate 100 is provided with a vertical plate 120 at a lower edge, and the connection part 220 of the connection member 200 is attached to the vertical plate 120, and the time sequence control board 300 is provided at an outer side of the vertical plate 120, and the length direction of the time sequence control board 300 is along a length direction of the vertical plate 120. In addition, the vertical plate 120 is provided with a plurality of snap grooves 110 which are evenly provided along the length direction of the vertical plate 120 and are used to snap the connection part 220, and the vertical plate 120 may be inclined at a certain angle with respect to the lower edge of the back plate 100, of course, as shown in FIG. 3, the vertical plate 120 is arranged on the lower edge of the back plate 100 along the horizontal direction, or the lower edge of the back plate 100 has a certain inclination angle, then the vertical plate 120 is provided on it, the specific arrangement manner is not limited herein. The snap groove 110 may be provided in a wall face of the vertical plate 120 where the vertical plate 120 is connected with the connection part 220, or the vertical plate 120 is passed through at several positions to form several snap grooves 110, and openings of the snap grooves 110 are formed so that the main body 222 of the connection part 220 can enter, when the main body 222 of the connection part 220 passes through the opening of the snap groove 110 and thus enter into the snap grooves 110 and is rotate by a certain angle, the main body 222 of the connection part 220 is stuck within the snap grooves 110.

Exemplarily, the protruding part 221 of the connection part is a wedge block to facilitate the rotation and then make mounting and detachment convenient. The wedge block is connected with the horizontal segment 222 of the buckling part at an end with a small section area and is connected with the snap groove 110 of the back plate at an end with a large section area. One side surface of the connection part 220 may be an oblique surface so as to conveniently insert the connection part into the snap groove 110 of the back plate.

Exemplarily, the connection part 220 is connected with a lower edge of the back plate 100, and positions for mounting screws need not be prearranged at upper edges of the back plate 100 and the front frame 600. The front frame 600 is, for example, a plastic frame, and it is not necessary for the iron frame to be provided to fix the back plate and the display screen. The display screen 400, the backlight module 500 and the back plate 100 mounted with the time sequence control board 300 are disposed into the plastic frame and finally covered with the rear cover 700, and holes for screws only need to be prearranged in lower edges, left edges and right edges of the back plate 100 and the plastic frame, the back plate 100 and the plastic frame are connected with the screws, it is only necessary to snap-fit upper edges of the back plate 100 and the plastic frame, and the time sequence control board 300 using a connection manner of snap-fitting can ensure a reliable connection between the back plate 100 and the time sequence control board 300 at the lower ledges, and it is only necessary to prearrange a hole for a screw with a small width in the lower edges to connect the plastic frame, and this structure is especially suitable for a direct type integrated machine.

It needs to be noted that the buckling part 210 may also be in a tubular shape with openings at two ends, and during mounting, it is only necessary to insert the time sequence control board. It needs to be noted that a cross-section of the connection part 220 can be in a butterfly shape, a cross shape and etc. In addition, the connection part 220 and the snap groove 110 may also be designed to be a quick pluggable connection structure, for example, the connection part is designed to be a connection rod shape, a telescopic boss is mounted on the connection rod, a lap groove matching the boss is provided at a corresponding position in the snap groove, a mechanism similar to a umbrella rib controlling extension and retraction of the boss is provided in the connection rod, the connection rod is inserted into the snap groove, and the boss is snapped in the lap groove, so that connection rod is connected with the snap groove.

Exemplarily, a plurality of connection members are evenly provided along the length direction of the time sequence control board. For example, there are five connection members 200. It needs to be noted that the number of the connection members 200 is not limited and is set according to the length of the time sequence control board to ensure the firm connection of the time sequence control board.

The above display device may be any product or part having a display function, such as a liquid crystal display, an electronic paper, an organic light-emitting display, a liquid crystal television, a digital photo frame, a mobile phone and a flat computer.

For the display device provided by an embodiment of the present invention, the edges of the time sequence control board and the back plate are connected in a manner of snapping, thus the connection is firm, and the problem of detachment of the time sequence control board is avoided due to vibration incurred by transporting, falling experiments and etc., scratching the display screen and then generating bright line at the display screen are also avoided. Furthermore, the time sequence control board is provided at a lower edge of the back plate, and positions for mounting screws need not be prearranged at upper edges of the back plate and front frame, which can reduce the widths of the upper and lower edges of the front frame, and then increases the display region of the display screen and achieves visual super-thin effect. Also, the time sequence control board may be provided at the lower edge of the back plate through a vertical plate, the time sequence control board is provided at an outer side of the vertical plate, and the vertical plate may have a certain inclination angle, at this moment, the time sequence control board may be supported after it is provided on the vertical plate, and the time sequence control board is also inclined at a certain angle with respect to a plane of the back plate to form an upturned structure at the lower edge of the back plate, so that the display screen will not be scratched even if the time sequence control board detaches. The structure and performance of the display device according to the embodiments of the present invention are stable.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. A display device, comprising:
    a time sequence control board; and
    a back plate, comprising one main body and a plurality of edges, the time sequence control board being attached to one of the edges of the back plate with a connection member, the connection member comprising a buckling part and a connection part connected with the buckling part, the buckling part being used to buckle the time sequence control board, and the connection part being connected with the edge of the back plate;
    wherein, the buckling part is in a form of the Chinese character "凹", comprising: a horizontal segment; two vertical segments provided at two ends of and connected with the horizontal segment; and two stop blocks, each provided at an end of the vertical segment not connected with the horizontal segment configured to buckle the time sequence control board.

2. The display device according to claim 1, wherein, the connection part is connected to a lower edge of the back plate.

3. The display device according to claim 1, wherein, the gap is equal to a thickness of the time sequence control board.

4. The display device according to claim 1, wherein, an inner length of the horizontal segment is equal to a width of the time sequence control board, and a distance between end parts of the two stop blocks along a length direction of the horizontal segment is smaller than the width of the time time sequence control board.

5. The display device according to claim 2, wherein, the back plate is formed with a vertical plate at a lower edge, and the connection part of the connection member is attached to the vertical plate.

6. The display device according to claim 5, wherein, the time sequence control board is provided at an outer side of the vertical plate of the back plate, and the length direction of the time sequence control board is along a length direction of the vertical plate.

7. The display device according to claim 1, wherein, the connection part is in a form of the Chinese character "凸", comprising a protruding part and a main body, and the protruding part is fixed to a back part of the horizontal segment of the buckling part.

8. The display device according to claim 7, wherein, the protruding part is fixed to a middle of the horizontal segment in the length direction.

9. The display device according to claim 1, wherein, the connection part and the buckling part are formed as an integrated body.

10. The display device according to claim 6, wherein, the vertical plate plate of the back plate is formed with a plurality of snap grooves which are evenly along the length direction of the vertical plate and are configured to snap the connection part.

11. The display device according to claim 1, wherein, the back plate is provided at an edge with snap grooves for snapping the connection part.

12. The display device according to claim 7, wherein, the protruding part of the connection part is a wedge block.

13. The display device according to claim 12, wherein, the wedge block is connected with the buckling part at an end with a small cross-section area and is connected with an edge of the back plate at an end with a large cross-section area.

14. The display device according to claim 1, wherein, a cross-section of the connection part is in a butterfly shape or a cross shape.

15. The display device according to claim 11, wherein, the snap grooves are evenly provided along the length direction of the time sequence control board.

16. The display device according to claim 1, wherein, the display device further comprises a front frame, a display screen and a backlight module.

17. The display device according to claim 16, wherein, the front frame is a plastic frame, and the display screen, the backlight module and the back plate mounted with the time sequence control board are disposed inside the plastic frame.

18. The display device according to claim 17, wherein, the back plate is connected with the plastic frame at a lower edge, a left edge and a right edge through screws.

* * * * *